United States Patent [19]

Ikegami

[11] Patent Number: 5,763,935
[45] Date of Patent: Jun. 9, 1998

[54] BIPOLAR SEMICONDUCTOR DEVICE AND FABRICATING METHOD THEREOF

[75] Inventor: Masaaki Ikegami, Tokyo, Japan

[73] Assignee: Mitsubishi Denki Kabushiki Kaisha, Tokyo, Japan

[21] Appl. No.: 670,674

[22] Filed: Jun. 26, 1996

Related U.S. Application Data

[63] Continuation-in-part of Ser. No. 421,355, Apr. 13, 1995, abandoned.

[30] Foreign Application Priority Data

Dec. 9, 1994 [JP] Japan .................................. 6-306131
Jun. 7, 1996 [JP] Japan .................................. 8-145682

[51] Int. Cl.$^6$ .................................................. H01L 27/082
[52] U.S. Cl. ......................................... 257/592; 257/487
[58] Field of Search ................................... 257/592, 487

[56] References Cited

FOREIGN PATENT DOCUMENTS 63-257261  10/1988  Japan .
1-196173   8/1989   Japan .
2-264436   10/1990  Japan .
2-266530   10/1990  Japan .
2-276272   11/1990  Japan .

OTHER PUBLICATIONS

A.S. Grove, "Physics and Technology of Semiconductor Devices," John Wiley & Sons, (1967) p. 159, Dec. 1967.

Primary Examiner—Mark V. Prenty
Attorney, Agent, or Firm—McDermott, Will & Emery

[57] ABSTRACT

The bipolar semiconductor device fabricated according to the present invention have high CB junction breakdown voltage ($BV_{CBO}$), small capacitance between collector and base and high response speed. A $n^+$ type well diffused layer 105 to be a base for vertical type transistor is formed to reach to a $p^+$ type buried region 104. Further, a $p^+$ type diffused layer 106 is formed to reach to the $p^+$ type buried region 104 and to surround the $n^+$ type well diffused layer 105 at intervals of the distance (d). The product NA(104)×ND(105) is adjusted to become larger then the product NA(106)×ND (102) wherein NA(104) is an impurity concentration of said buried layer (104) of said first conductive type to be a collector; NA(106) is an impurity concentration of said diffusion region (106) to be a collector electrode; ND(102) is an impurity concentration of said epitaxial layer (102) of said second conductive type; ND(105) is an impurity concentration of said well region (105) of said second conductive type to be a base for transistor.

5 Claims, 9 Drawing Sheets

BIPOLAR SEMICONDUCTOR DEVICE AND FABRICATING METHOD THEREOF

This is a Continuation-In-Part of U.S. patent application Ser. No. 08/421,355 filed Apr. 13, 1995 now abandoned.

BACKGROUND OF THE INVENTION

1. Field of the Invention

The present invention relates to a bipolar semiconductor device, especially to a vertical type bipolar semicondoctor device improving high operation speed and high breakdown voltage, and its fabricating method.

2. Description of Related Art

Currently, bipolar semiconductor devices have been proposed in Japanese patents Tokkaihei No. 1-196173 (Nikon); Tokkaihei Nos. 2-264436 and 2-276272 (Olympus); and Tokkaihei No. 2-266530 (Sony).

As conceptionally shown in FIG. 19, each of these semiconductor devices comprises a semiconductor substrate 101 of a first conductive type, an epitaxial layer 102 of a second conductive type (a conductive type opposite to the first conductive type, if the first conductive is p type, the second conductive type is n type) formed on the semiconductor substrate, a first buried layer 103 of the second conductive type formed between the epitaxial layer 102 and the semiconductive substrate 101, a second buried layer 104 of the first conductive type to be a collector for transistor formed in the first buried layer 103 of the first conductive type, a well region 105 of the second conductive type to be a base for transistor formed in a part of the epitaxial layer 102 and have a higher impurity concentration that of the epitaxial layer, a diffused region 106 of the first conductive type to be a collector electrode for transistor being in contact with the second buried layer 104 of the first conductive type, and a diffused region 107 of the first conductive type to be an emitter for transistor formed into the said well region 105.

In the said semiconductor device, the well region 105 is not directly in contact with the second buried layer 104 and is, through the epitaxial layer 102, in contact therewith, so that a resistance in a depth direction of the base is relatively large, resulting in lowering the operation speed in the vertical type pnp-transistor and varying the vertical transistor characteristics such as junction breakdown voltage and capacitance due to varying of the epitaxial thickness and so on. In order to obviate the above drawback, the inventors have developed a semiconductor device shown in FIG. 16. In the improved embodiment, the well region 105 is formed to extend from the surface of said epitaxial region 102 to the surface of the second buried layer 104, which results in lowering the base resistance in the depth direction, improving the operation speed and canceling the vary of the transistor characteristics.

As shown in FIG. 15, the improved semiconductor device is fabricated as follows.

Firstly, a n⁻-type epitaxial layer 5 is grown on a main surface of a p-type silicon substrate 1. Secondly, within the n⁻-type epitaxial layer 5 and the main surface of the p-type silicon substrate 1, there are formed a n⁻-first buried layer 2 and a n⁺-buried layer 3. Thirdly, within the n⁻-first buried layer 2 and around the layer 2 and the n⁺-buried layer 3, there are formed a p⁺-second buried layer 4 and layers 4'. Fourthly, a p⁺-type diffused layer 6 to be a collector and a p⁺-type diffused layer 6' to be an isolation are formed to extend and contact to the p⁺-second buried layers 4, 4'. Fifthly, a n⁺-well diffused layer 11 is formed to extend from the surface of the epitaxial layer 5 to the surface of the second buried layer 4. Finally, within each surfaces of the n⁺-well diffused layer 11 and the n⁻-epitaxial layer 5, there are formed a p⁺-type diffused layer 7 and a n⁺-type diffused layer 8. Further, a p⁺-type collector diffused layer 9 and a protective layer 10 are formed on each diffused layers. 12 indicates an insulating oxide layer.

In the vertical pnp type transistor, CB junction parasitic capacitance tends to be larger, the response speed tends to lower, CB junction breakdown voltage tends to lower depending on (1) the surface impurity concentration in the diffused region of the first conductive type, (2) the impurity concentration and diffused depth of the n⁺-well diffused layer and (3) the impurity concentration and thickness of the n⁻-type epitaxial layer, resulting in operation failure of the vertical type transistor.

Trying to find the cause of the operation failure, we have found the main structural cause that n⁺-well diffused layer 11 and p⁺-type diffused layer 6 may substantially contact each other due to reduction of the transistor area and may be frequently formed by a conventional fabricating method.

Accordingly, a first objective of the present invention is to provide a lower base resistance in the depth direction thereof, improved high operation speed and no variance of the transistor characteristics with a semiconductor device wherein said well region of the second conductive type 105 extend from the surface of said epitaxial layer 102 of the second conductive type to the surface of 104 and is surrounded by said diffused region of the first conductive type 106.

Further, a second objective of the present invention is to provide a method for fabricating a semiconductor device provided with a lower base resistance in the depth direction thereof, improved high operation speed and no variance of the transistor characteristics.

SUMMARY OF THE INVENTION

According to a first aspect of the present invention, there is provided a bipolar semiconductor device which comprises;

(1) a semiconductive substrate of a first conductive type;

(2) an epitaxial layer or layers of a second conductive type formed on said semiconductive substrate;

(3) a buried layer or layers of said second conductive type formed between the epitaxial layer and the semiconductive substrate;

(4) a buried layer or layers of said first conductive type to be a collector for transistor formed in said buried layer of said second conductive type;

(5) a well region or regions of said second conductive type to be a base for transistor formed in a part of said epitaxial layer and provided with higher impurity concentration than said epitaxial layer;

(6) a diffused region or regions of said first conductive type to be a collector electrode for transistor formed on said buried layer of said first conductive type; and (7) a diffused region or regions of said first conductive type to be an emitter for transistor formed in said well region, said well region of said second conductive type to be a base for transistor being in contact with said buried layer of said first conductive type to be a collector for transistor and being enclosed with said diffused region to be a collector electrode of the said transistor through said epitaxial layer of said well region having a distance (d) in the horizontal direction of transistor, the product NA(104)×ND(105) being adjusted to be larger than the product NA(106)×ND(102) wherein NA(104) is an impurity concentration of said buried layer of said first conductive type to be a collector; NA(106) is an impurity concentration of said diffusion region to be a collector electrode; ND(102) in an impurity concentration of said epitaxial layer of said second conductive type; ND(105) is an impurity concentration of said well region of said second conductive type to be a base for transistor.

According to the first invention, as shown in FIG. 16, lowering the base resistance in the depth direction thereof, improvement of the operation speed for transistor and no variance of the transistor characteristics can be accomplished by means of (1) forming said well region of the second conductive type (105) to extend from said epitaxial layer (102) of the second conductive type to said second buried layer of the first conductive type (104).

Further, the impurity distribution between the CB junction is relatively gentle by means of (2) forming said well region of the second conductive type (105) in said epitaxial layer (102) of the second conductive type to be surrounded at intervals of the distance (d) by said diffused region of the first conductive type (106). For example, if the impurity concentration NA(104) is set to an order of $10^{18}$ cm$^{-3}$ and the impurity concentration ND(105) is set to an order of $10^{17}$ cm$^{-3}$ while the impurity concentration NA(106) is set to an order of $10^{18}$ cm$^{-3}$ and the impurity concentration ND(102) is set to an order of $10^{15}$ cm$^{-3}$, the impurity profiles of A–A' line and B–B' line in FIG. 16 are shown as in FIG. 18 A and FIG. 18 B.

Furthermore, observing the relation between the distance (d) and the CB junction breakdown voltage shown in FIG. 17, it was believed that the CB junction breakdown voltage would be strongly affected by p$^+$ surface concentration and thus the relation lines were shifted down depending on the p$^+$ surface concentration varying from a small concentration (0.5) to a large concentration (5.0). Therefore, considering the surface concentration, it was believed that it was important to determine the distance (d) to achieve a desired CB junction breakdown voltage in the bipolar semiconductor device according to the present invention. However, it has been found that the breakdown voltage between the CB junction should be determined at the (β) point of FIG. 16 where the well region (105) and the buried layer (104) are connected, rather than at the (α) point of FIG. 16, provided that the product NA(104)×ND(105) is adjusted to be larger than the product NA(106)×ND(102), because the width (W) of depletion layer can be calculated on the basis of the formula:

$$W \propto \sqrt{\{(NA+ND)/(NA \times ND)\}}$$

shown in A. S. Grove, "Physics and Technology of Semiconductor Devices," Jone Wiley & Sons p. 159 (1967), resulting the depletion layer width between the buried layer (104) and the well region (105) is smaller than the depletion layer width between the collector electrode layer (106) and the epitaxial layer (102).

In a preferred embodiment, a field oxide layer or layers may be formed on a surface from an end of said diffused region of the first conductive type to be a collector electrode to an end of said well region of the second conductive type because CB junction breakdown voltage is affected by the surface impurity concentration between the collector region and the base region. The thickness of the field oxide film is preferably from 0.3 μm to 2.0 μm.

Seen from FIG. 17, the field oxide film formed between the end of said diffused region of the first conductive type 106 and the end of said second buried layer of the first conductive type 104 makes the impurity concentration between CB junction gentle.

Considering an acceptable error on fabricating, especially photolithographic masking process, the distance (d) from the end of said diffused region of said first conductive type to be a collector electrode to the end of said well region of said second conductive type is preferably 0.5 μm or more to prevent contact between said well region of the second conductive type 105 and said diffused region of the first conductive type 106.

Considering between collector and base (BV$_{CBO}$), collector and emitter (BV$_{CEO}$) breakdown voltages (3 V, 6 V, 9 V and 12 V) to be generally required, the impurity concentration in said epitaxial layer should be selected from $2.0\times10^{15}$ cm$^{-3}$ to $1.0\times10^{16}$ cm$^{-3}$.

If the impurity concentration in said epitaxial layer 102 of the second conductive type is set within the scope from $2.0\times10^{15}$ cm$^{-3}$ to $1.0\times10^{16}$ cm$^{-3}$, a more improved CB junction breakdown voltage can be obtained.

The impurity concentration of said well region of the second conductive type, which is higher than that of said epitaxial layer, should be selected from $2.0\times10^{16}$ cm$^{-3}$ to $5.0\times10^{17}$ cm$^{-3}$, because it affects current amplification factor and frequency characteristic as well as the CB junction breakdown voltage.

If the impurity concentration of said well region of the second conductive type 105 is set within the scope from $2.0\times10^{16}$ cm$^{-3}$ to $5.0\times10^{17}$ cm$^{-3}$, an improved current amplification factor and frequency characteristic as well as the improved CB junction breakdown voltage can be obtained.

The thickness of said epitaxial layer of the second conductive type is preferably from 0.5 μm to 10.0 μm and the impurity diffused depth of said well region of the second conductive type is preferably from 0.5 μm to 7.0 μm, because the thickness of said epitaxial layer and thus the impurity diffused depth of said well region in connection with the thickness affect said CB junction breakdown voltage in the same way as the impurity concentration.

If the thickness of said epitaxial layer 102 of the second conductive type is set within the scope from 0.5 μm to 10.0 μm, a further improved CB junction breakdown voltage can be obtained. In accompany with this, if the impurity diffused depth of said epitaxial layer 102 of the second conductive type is set within the scope from 0.5 μm to 7.0 μm, a further improved current amplification factor and frequency characteristic as well as the improved CB junction breakdown voltage can be obtained.

There are proposed two methods for fabricating a bipolar semiconductor device according to the present invention. A first method comprises steps of forming a diffused region of the first conductive type to be a collector for transistor and then forming a well region of the second conductive type to be a base for transistor, which has a higher impurity concentration than that of said epitaxial layer, in a part of said epitaxial layer. On the other hand, a second method comprises steps of forming a well region of the second conductive type to be a base for transistor, which has a higher impurity concentration than that of said epitaxial layer, in a part of said epitaxial layer and then forming a diffused region of the first conductive type to be a collector for transistor. In order to make sure of contact between the well region of the second conductive type and the buried layer to be a collector for transistor while the well region is surrounded through the distance (d) of the epitaxial layer by the buried layer of the first conductive type, it is more advantageous to fabricate the semiconductor device according to the second method.

Therefore, according to a second aspect of the present invention, there is proposed a method for fabricating a bipolar semiconductor, which comprises steps of: forming said first buried layer of the second conductive type in the predetermined range of the main surface of said semiconductive substrate of the first conductive type, forming said second buried layer of the first conductive type in said first buried layer of the second conductive type, growing said epitaxial layer of the second conductive type on the all surface of the semiconductor substrate of first conductive type including said first and second buried layers of the first and second conductive type, forming said well region of the second conductive from the surface of said second buried layer of the first conductive type, thereafter forming said diffused region of the first conductive type to enclose said well region of the second conductive type at intervals of the distance (d) and extend to said second buried layer of the first conductive type, and forming said diffused region to be the emitter of the first conductive type in said well region of the second conductive type, so as to make the product NA(104)×ND(105) larger than the product NA(106)×ND(102) wherein NA(104) is an impurity concentration of said buried layer of said first conductive type to be a collector; NA(106) is an impurity concentration of said diffusion region to be a collector electrode; ND(102) is an impurity concentration of said epitaxial layer of said second conductive type; ND(105) is an impurity concentration of said well region of said second conductive type to be a base for transistor.

In a preferred method for fabricating a bipolar semiconductor, it further comprises at least a step of forming a field oxide film on said surface from the end of said well region of the second conductive type to be a base for transistor to the end of said diffused region to be a collector for transistor.

According to the second invention, there are easily fabricated a semiconductor provided with contact between said well region of the second conductive type 105 and said second buried layer of the first conductive type 104 while said well region of the second conductive type 105 is surrounded through the distance (d) of said epitaxial layer 102 of the second conductive type by said diffused region of the first conductive type 106. Further, if the semiconductor is fabricated according to the step of forming the field oxide film, the impurity distribution between the CB electrodes becomes gentle and thus can prevent the CB breakdown voltage from lowering. The parasitic capacitance becomes small and the response speed becomes fast.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein:

FIG. 18 B is an impurity profile of B–B' line of FIG. 16.

DETAILED DESCRIPTION OF THE PREFERRED EMBODIMENTS

The preferred embodiments of the present invention shown in FIGS. 1 to 14 showing vertical type pnp bipolar semiconductor are described below with reference to the figures. The same construction can be applied to the vertical type npn bipolar semiconductor device.

Embodiment 1

Figure 1:
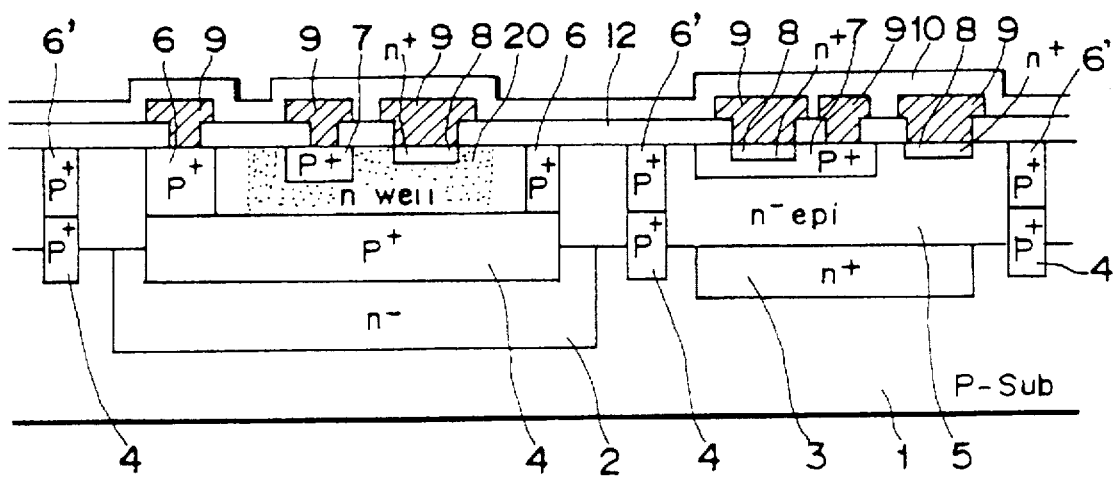
FIG. 1 in a sectional view of a first embodiment according to the present invention.

A first embodiment of the bipolar semiconductor device is shown in FIG. 1 and the method for fabricating the first embodiment according to the present invention is explained with FIGS. 3 to 8.

As shown in FIG. 1, a n$^-$ type epitaxial layer 5 is formed on the main surface of p type silicon substrate. 1. A n$^-$ type buried and diffused layer 2 and a n$^+$-buried layer 3 are formed within the n$^-$-type epitaxial layer 5 and on the main surface of the p type silicon substrate 1. Furthermore, a p$^+$-second buried layer 4 is formed within the n$^-$ type buried and diffused layer 2 and aroundthere and around the n⁺-buried layer 3.

A n⁺-type well diffused layer 20 is formed to extend from the surface of the n⁻-type epitaxial layer 5 to the p⁺-second buried layer 4. A p⁺-type diffused layer 6 is formed to reach to the p⁺-second buried layer 4 and surround the n⁺-type well diffused layer 20 at intervals of a determined distance therefrom. A p⁺-type diffused isolation layer 6' is also formed in an isolation region to extend to the p⁺-second buried layer 4. Furthermore, a p⁺-type diffused layer 7 and a n⁺-type diffused layer 8 are formed within the surfaces of the n⁺-type well diffused layer 20 and the n⁻-type epitaxial layer 5. Then, a p⁺-type collector diffused layer 9 and a protective layer 10 of each diffused layers are formed.

The manufacturing method for bipolar semiconductor device shown in FIG. 1 is described belong with FIGS. 3 to 8.

Figure 3:
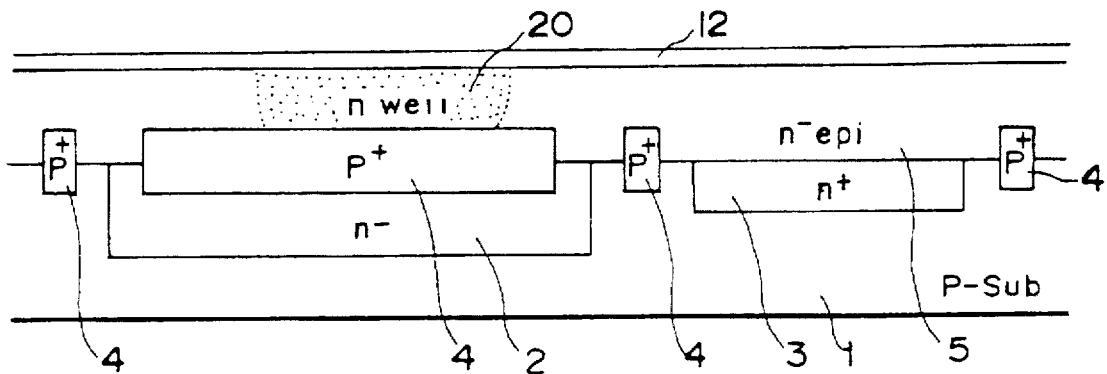
FIG. 3 is a sectional view showing a first step of process for fabricating a first embodiment of the bipolar semiconductor device according to the present invention.

Firstly, as shown in FIG. 3, the n⁻ type buried and diffused layer 2, the n⁺-buried layer 3 and the p⁺-second buried layer 4 are formed on said p type silicon substrate 1 by a conventional method, and the n⁻-type epitaxial layer 5 is formed on the main surface. The impurity concentration is adjusted to be $2.0 \times 10^{15}$ cm$^{-3}$ or more and $1.0 \times 10^{16}$ cm$^{-3}$ or less and the thickness of the n⁻-type epitaxial layer 5 is adjusted to be 1.0 μm or more and 10.0 μm or less. Furthermore, the insulating oxide film 12 is formed on the surface.

The resist pattern is formed according to a photolithographic method and n type impurity such as phosphorus ion is doped in the predetermined region according to an ion implantation method. The n⁺-type well diffused layer 20 to be a base for vertical type pnp transistor is formed after removing the resist and heat-treating at 800° to 1100° C. The impurity concentration is preferably selected from $2.0 \times 10^{16}$ cm$^{-3}$ to $5.0 \times 10^{17}$ cm$^{-3}$, and the impurity diffused depth is preferably selected in the range from 0.5 to 5.0 μm, more preferably from 1.5 μm to 5.0 μm. In this case, to make sure of connect between the n⁺-type well diffused layer 20 and the p⁺-second buried layer 4, it is important to pay attention to predetermine the temperature and time of heat treatment.

Figure 4:
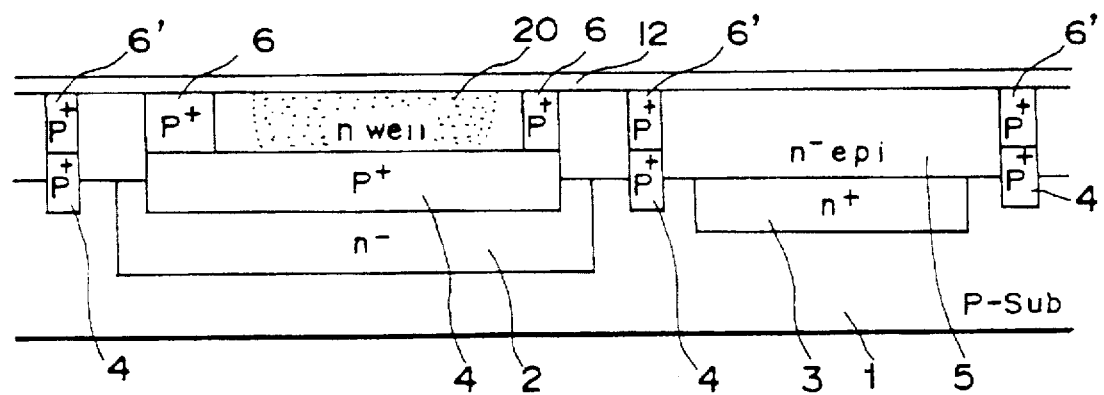
FIG. 4 is a sectional view showing a second step of process for fabricating a first embodiment of the bipolar semiconductor device according to the present invention.

Secondly, as shown in FIG. 4, p type impurity is doped in the p⁺-second buried layer 4 to be an isolation region to form the p⁺-type diffused isolation layer 61, at the same time, p type impurity is doped in the n⁺-type well diffused layer 20 to be a base for vertical type pnp transistor at intervals of the predetermined distance (for example 0.5 μm to 3 μm) and surrounded thereby to form the p⁺-type diffused layer 6 (the surface concentration is about $1.0 \times 10^{18}$ cm$^{-3}$ to $5.0 \times 10^{18}$ cm$^{-3}$). The predetermined distance makes it possible to prevent the lowering of CB junction breakdown voltage (BV$_{CBO}$).

Figure 5:
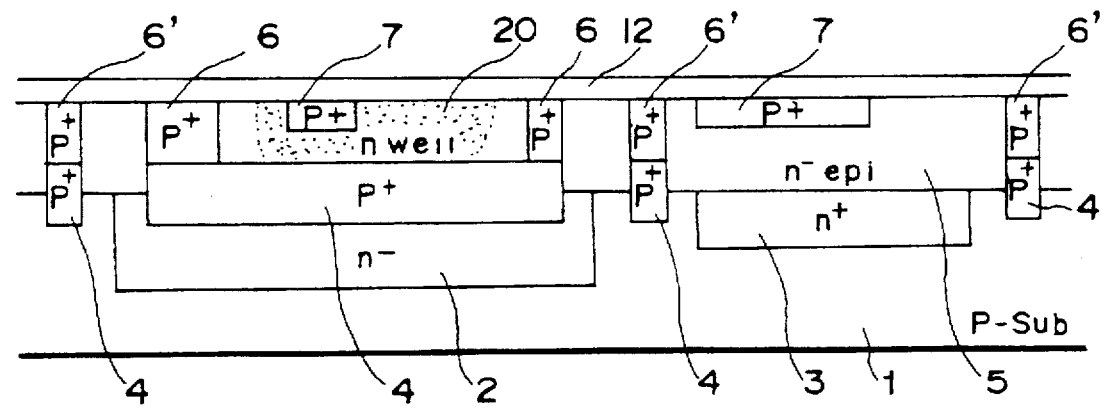
FIG. 5 is a sectional view showing a third step of process for fabricating a first embodiment of the bipolar semiconductor device according to the present invention.

Thirdly, as shown in FIG. 5, p type impurity is doped into the predetermined region within the n⁺-type well diffused layer 20 and the n⁻-type epitaxial layer 5 to form the p⁺-type diffused layer 7 to be a base and an emitter for vertical type pnp or npn transistor.

Figure 6:
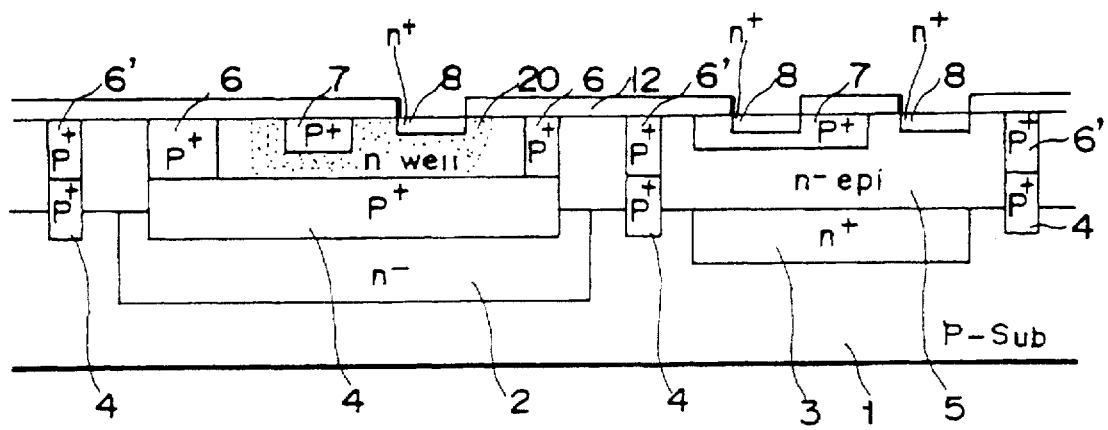
FIG. 6 is a sectional view showing a fourth step of process for fabricating a first embodiment of the bipolar semiconductor device according to the present invention.

Fourthly, as shown in FIG. 6, the insulating oxide film 12 within the n⁺-type well diffused layer 20, the n⁻-type epitaxial layer 5 and the p⁺-type diffused layer 7 to be a base for vertical type npn transistor is etched, n type impurity being doped to form the n⁺-type diffoued layers 8 to be a base for vertical type pnp transistor, a collector and an emitter for vertical type npn transistor.

Figure 7:
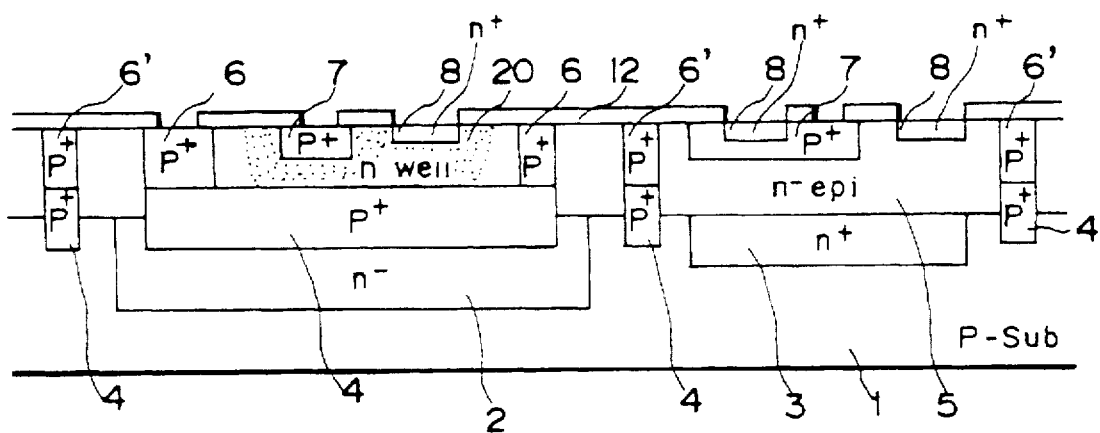
FIG. 7 is a sectional view showing a fifth step of process for fabricating a first embodiment of the bipolar semiconductor device according to the present invention.

Fifthly, as shown in FIG. 7, contact holes to extend to p⁺ type diffused layers of the electrodes of each transistor are formed by a conventional fine processing method.

Figure 8:
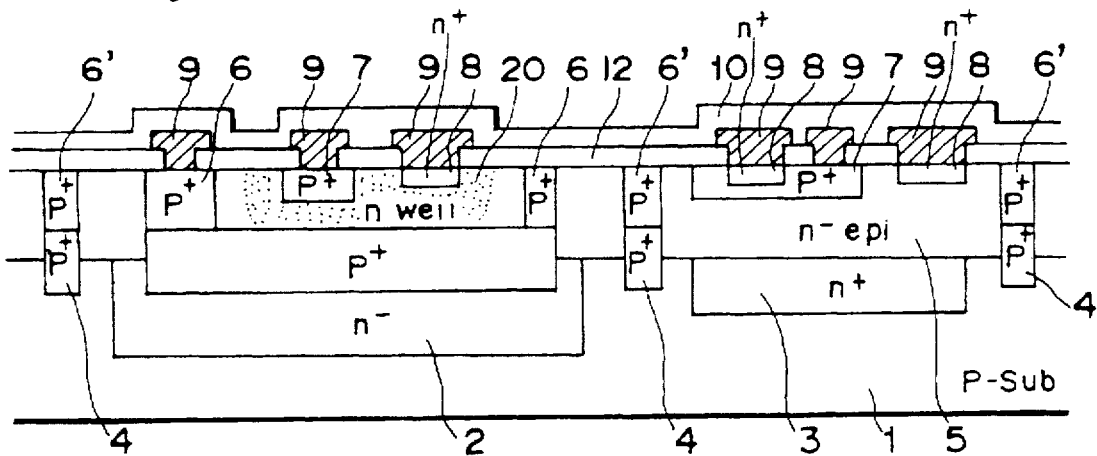
FIG. 8 is a sectional view showing a sixth step of process for fabricating a first embodiment of the bipolar semiconductor device according to the present invention.

Finally, as shown in FIG. 8, the p⁺-type collector diffused layer 9 and the protective layer 10 are formed by a well-known method to give the bipolar semiconductor device shown in FIG. 1.

Embodiment 2

Figure 2:
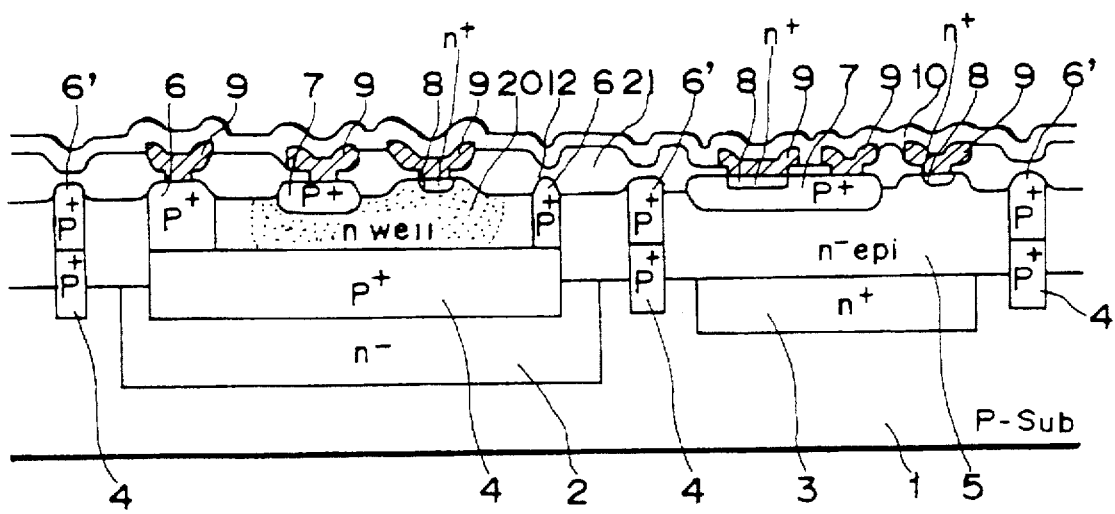
FIG. 2 is a sectional view of a second embodiment according to the present invention.

The bipolar semiconductor device in Embodiment 2 shown in FIG. 2 according to the present invention is explained with FIGS. 9 to 14. FIG. 2 is a sectional view showing bipolar semiconductor device in the Embodiment 2 according to the present invention.

As shown in FIG. 2, the n⁻-type epitaxial layer 5 is formed on the main surface of said p type silicon substrate 1. The n⁻ type buried and diffused layer 2 and the n⁺-buried layer 3 are formed in the n⁻-type epitaxial layer 5 and on the main surface of said p type silicon substrate 1. Furthermore, the p⁺-second buried layer 4 is formed in the n⁻ type buried and diffused layer 2 and around it and around the n⁺-buried layer 3.

The n⁺-type well diffused layer 20 is formed to extend from the surface of the n⁻-type epitaxial layer 5 to the p⁺-second buried layer 4. The field oxide layer 21 is formed at least on the surface between the n⁺-type well diffused layer 20 and the n⁻-type epitaxial 15.

The p⁺-type diffused layer 6 is formed to reach to the p⁺-second buried layer 4 and be surrounded in the predetermined distance which is determined by the field oxide layer 21 from the n⁺-type well diffused layer 20. At the same time, the p⁺-type diffused layer 6 is formed to extend to the p⁺-second buried layer 4 in the region to be isolated. Moreover, the p⁺-type diffused layer 7 and the n⁺-type diffused layer 8 are formed in the n⁺-type well diffused layer 20 and on the surface of the n⁻-type epitaxial layer 5. Accordingly, the p⁺-type collector diffused layer 9 and the protective layer 10 in the metal electrode of each diffused layers are formed.

Hereinafter, a method for fabricating a second embodiment of the bipolar semiconductor device shown in FIG. 2 is explained with reference to FIGS. 9–14.

Figure 9:
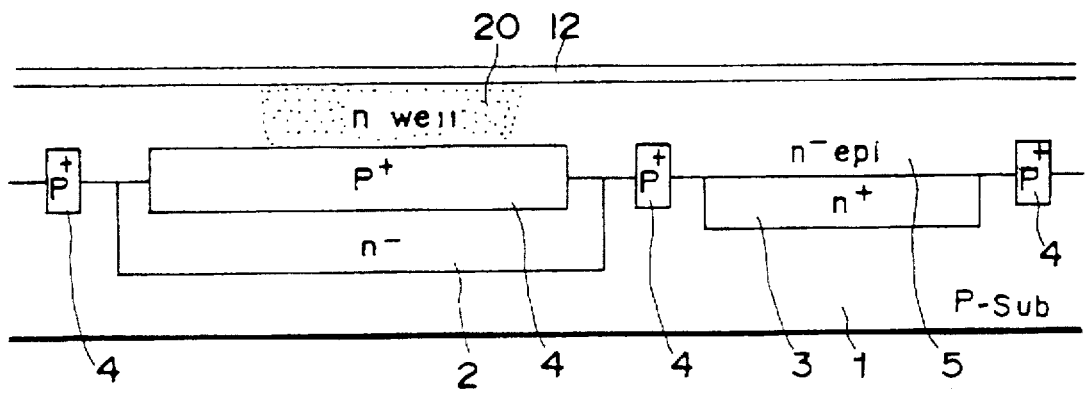
FIG. 9 is a sectional view showing a first step of process for fabricating a second embodiment of the bipolar semiconductor device according to the present invention.

Firstly, shown in FIG. 9, the n⁻ type buried and diffused layer 2, the n⁺-buried layer 3 and the p⁺-second buried layer 4 are formed on said p type silicon substrate 1 in the same way to the first Embodiment, on which main surface there is formed the n⁻-type epitaxial layer 5. Further, on the determined region of the n⁻-type epitaxial layer 5, there is formed the n⁺-type well diffused layer 20.

Figure 10:
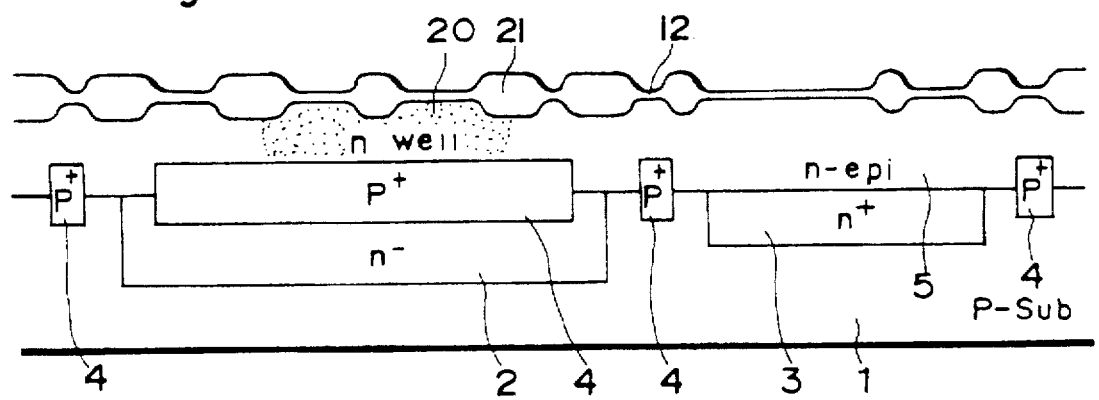
FIG. 10 is a sectional view showing a second step of process for fabricating a second embodiment of the bipolar semiconductor device according to the present invention.

Secondly, shown in FIG. 10, the field oxide layer 21 20 is formed at least on a surface between the n⁺-type well diffused layer 20 and the n⁻-type epitaxial layer 5 by means of selective oxidation of LOCOS (Local Oxidation of Silicon) method. Provision of the field oxide layer 21 can prevent the n⁺-type well diffused layer 20 from laterally diffusing during after-heat treatment, resulting in a gentle impurity distribution of 6, so that lowering of the CB junction breakdown voltage can be prevented and the bipolar semiconductor device having small capacitance can be obtained.

Figure 11:
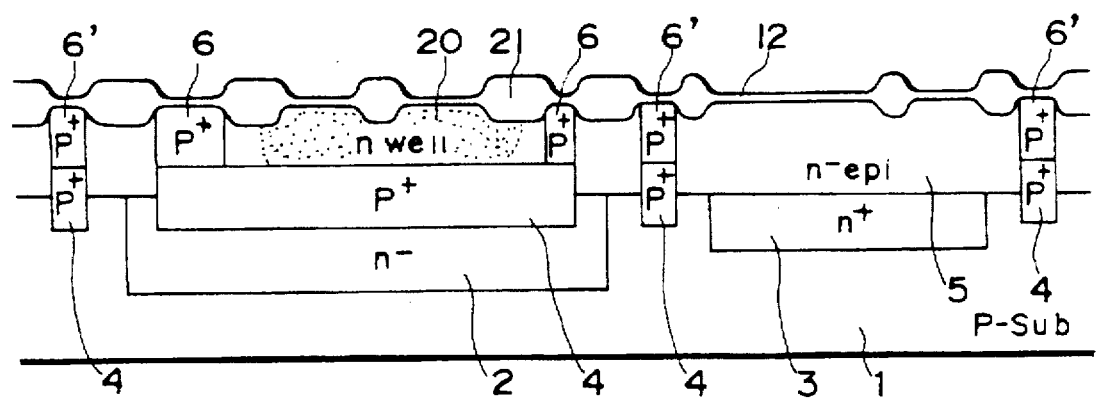
FIG. 11 is a sectional view showing a third step of process for fabricating a second embodiment of the bipolar semiconductor device according to the present invention.

Thirdly, shown in FIG. 11, the p⁺-type diffused layer 6 is formed by dopina p type impurity in the n well diffused layer at the intervals defined by the field oxide layer 21 to surround the n⁺-type well diffused layer 20. At the same time, the p⁺-type diffused isolation layer 6' is formed by doping p type impurity in the p⁺-second buried layer 4. The p⁺-type diffused layer 6 and the p⁺-type diffused isolation layer 6' may be formed and self-aligned to the field oxide layer 21 as shown in FIG. 11.

Figure 12:
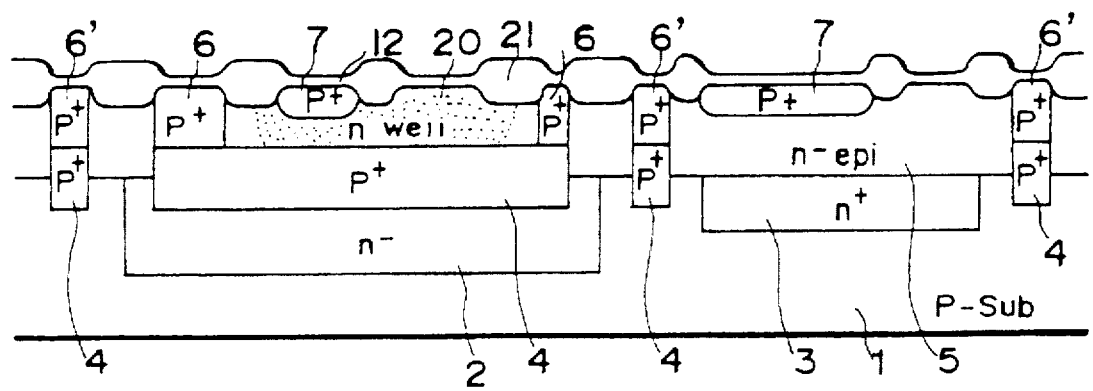
FIG. 12 is a sectional view showing a fourth step of process for fabricating a second embodiment of the bipolar semiconductor device according to the present invention.

Fourthly, shown in FIG. 12, the p⁺-type diffused layers 7 to be an emitter and a base for vertical type pnp transistor are formed by doping p type impurity in a determined region within the n+-type well diffused layer 20 and the n−-type epitaxial layer 5. The p+-type diffused layer 7 may be formed and self-aligned to the field oxide layer 21.

Figure 13:
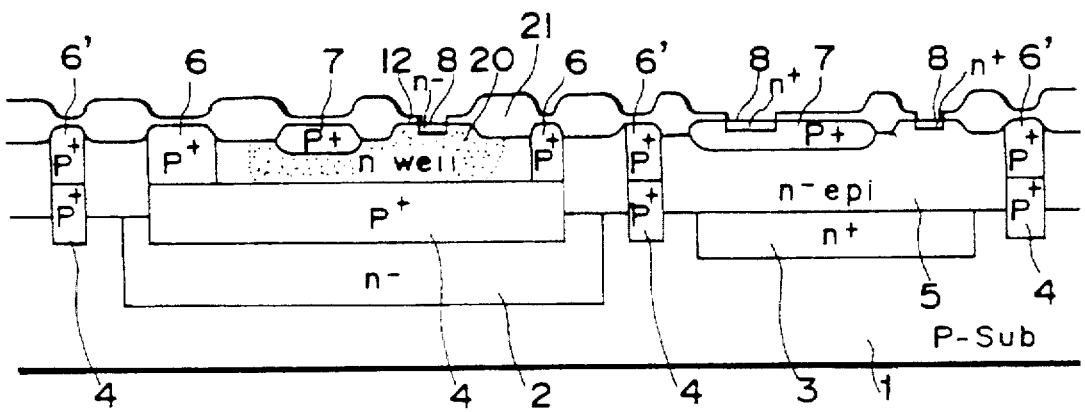
FIG. 13 is a sectional view showing a fifth step of process for fabricating a second embodiment of the bipolar semiconductor device according to the present invention.

Fifthly, shown in FIG. 13, the n+-type diffused layers 8 to be a base, a collector and an emitter respectively, are formed by etching insulating oxide film 12 and doping n type impurity into the n+-type well diffused layer 20, the n−-type epitaxial layer 5 and the p+-type diffused layer 7.

Figure 14:
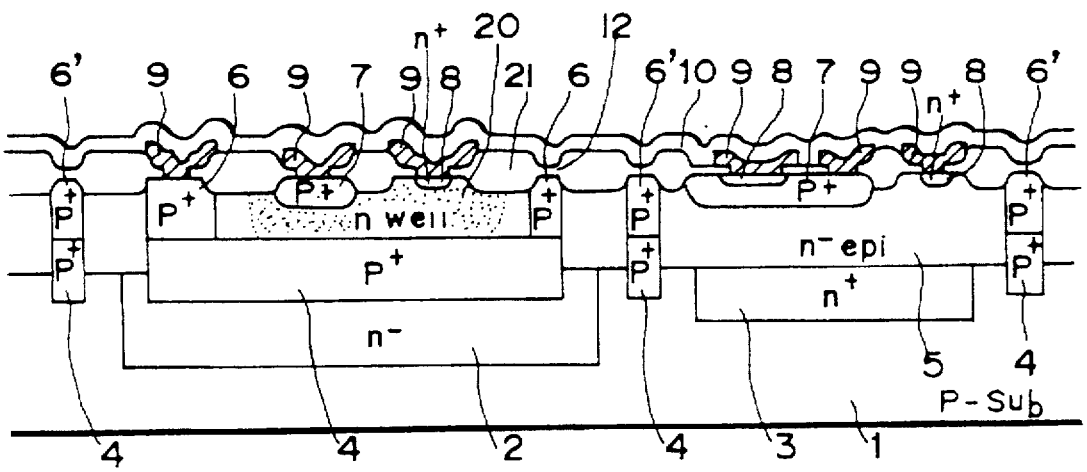
FIG. 14 is a sectional view showing a sixth step of process for fabricating a second embodiment of the bipolar semiconductor device according to the present invention.
Figure 15:
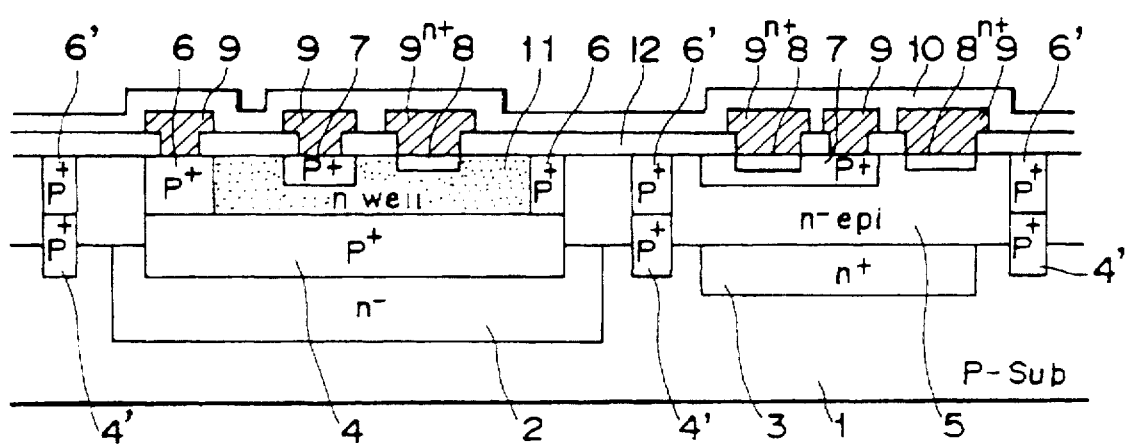
FIG. 15 is a sectional view showing a bipolar semiconductor on the way to a complete one.
Figure 16:
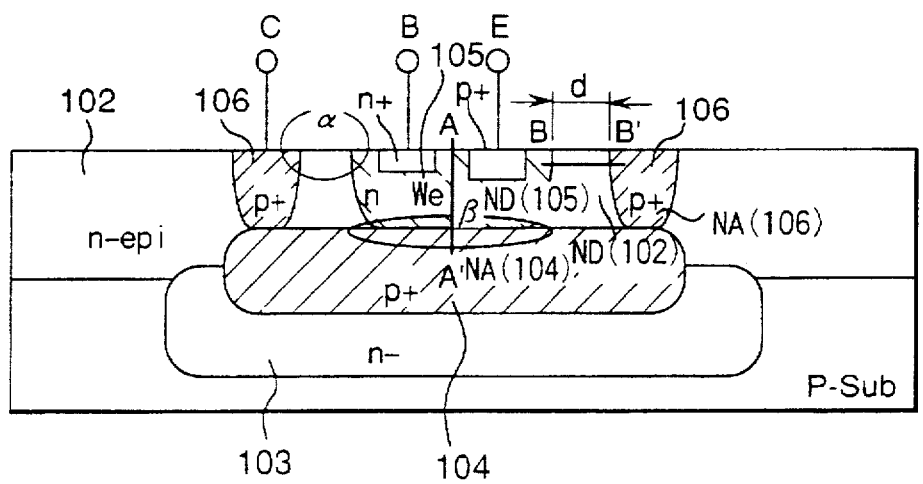
FIG. 16 is a conceptional view of the bipolar semiconductor device according to the present invention.
Figure 17:
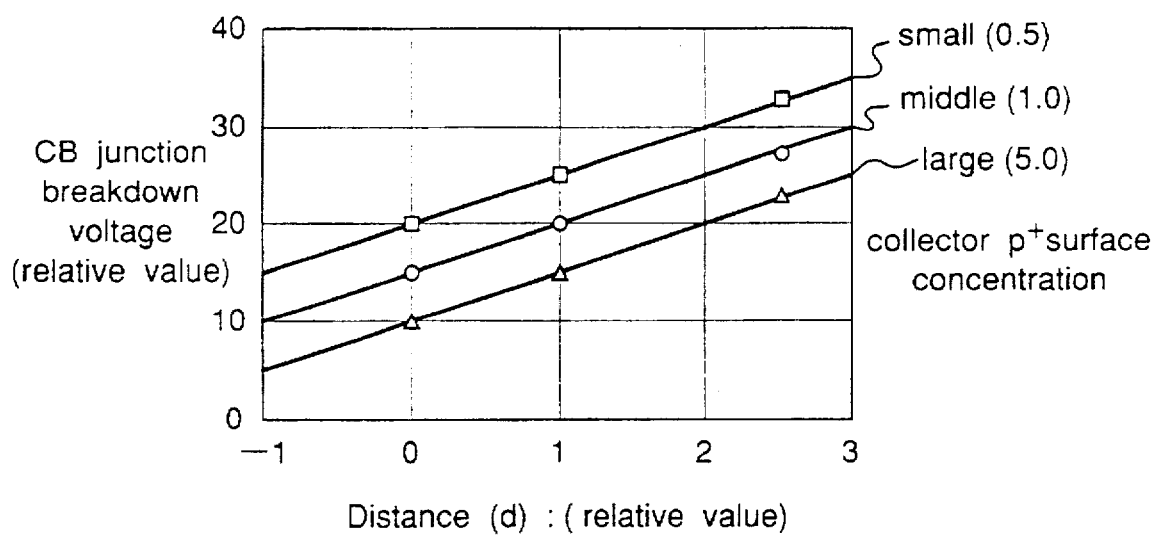
FIG. 17 is a relation view between the CB distance (d) and the CB junction breakdown voltage depending on the surface impurity concentration as a parameter.
Figure 18A:
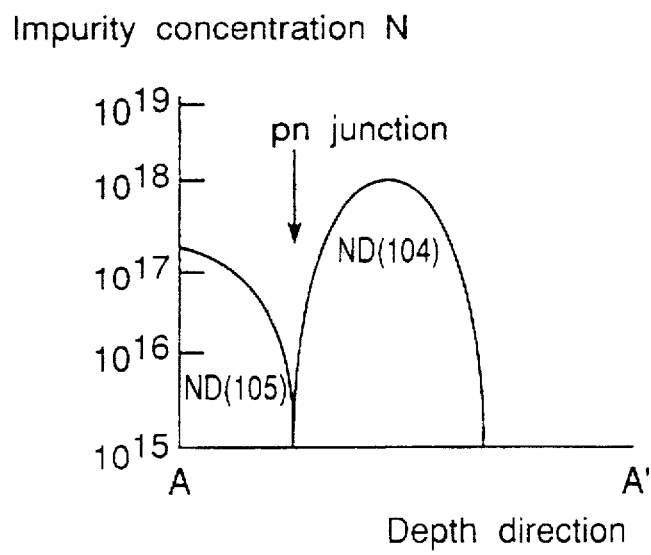
FIG. 18 A is an impurity profile of A–A' line of FIG. 16.
Figure 18B:
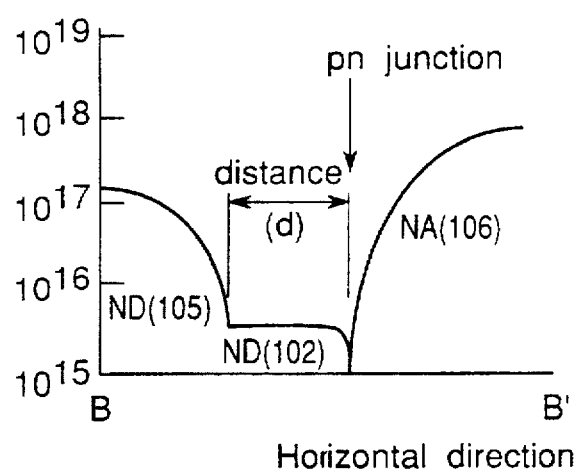
Figure 19:
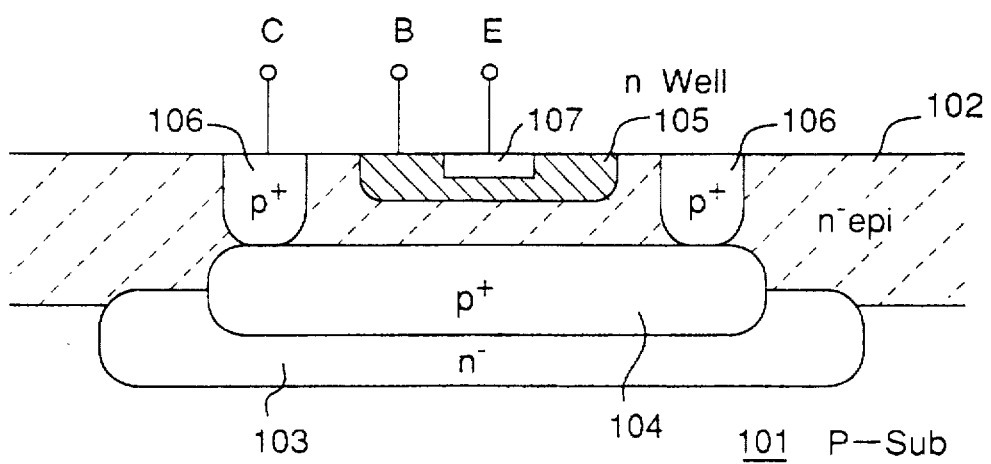
FIG. 19 is a conceptional view of a conventional bipolar semiconductor device.

Finally, shown in FIG. 14, contact holes are formed in p+ type diffused layers for each transistor and the p+-type collector diffused layer 9 and the protective layer 10 are formed by a well known method to give the bipolar semiconductor device shown in FIG. 2.

What is claimed is:

1. A bipolar semiconductor device which comprises;
   (1) a semiconductive substrate of a first conductive type;
   (2) an epitaxial layer or layers of a second conductive type formed on said said conductive substrate;
   (3) a buried layer or layers of said second conductive type formed between the epitaxial layer and the semiconductive substrate;
   (4) a buried layer or layers of said first conductive type to be a collector for transistor formed in said buried layer of said second conductive type;
   (5) a well region or regions of said second conductive type to be a base for transistor formed in a part of said epitaxial layer and provided with higher impurity concentration than said epitaxial layer;
   (6) a diffused region or regions of said first conductive type to be a collector electrode for transistor formed on said buried layer of said first conductive type; and
   (7) a diffused region or regions of said first conductive type to be an emitter for transistor formed in said well region,
   said well region of said second conductive type to be a base for transistor being in contact with said buried layer of said first conductive type to be a collector for transistor and being enclosed with said diffused region to be a collector electrode of the said transistor through said epitaxial layer of said well region having a distance d in the horizontal direction of transistor, the product NA(104)×ND(105) being adjusted to be larger than the product NA(106)×ND(102) wherein NA(104) is an impurity concentration of said buried layer of said first conductive type to be a collector; NA(106) is an impurity concentration of said diffusion region to be a collector electrode; ND(102) is an impurity concentration of said epitaxial layer of said second conductive type; ND(105) is an impurity concentration of said well region of said second conductive type to be a base for transistor.

2. The bipolar semiconductor device according to claim 1, wherein a field oxide layer or layers is formed on a surface from an end of said diffused region of said first conductive type to be a collector electrode to an end of said well region of said second conductive type.

3. The bipolar semiconductor device according to claim 1, wherein the impurity concentration in said epitaxial layer of said second conductive type is from $2.0 \times 10^{15}$ cm$^{-3}$ to $1.0 \times 10^{16}$ cm$^{-3}$ and the impurity concentration of said well region of said second conductive type, which is higher than that of said epitaxial layer, is from $2.0 \times 10^{16}$ cm$^{-3}$ to $5.0 \times 10^{17}$ cm$^{-3}$.

4. The bipolar semiconductor device according to claim 1, wherein the distance (d) from the end of said diffused region of said first conductive type to be a collector electrode to the end of said well region of said second conductive type is 0.5 μm or more.

5. The bipolar semiconductor device according to claim 2, wherein the thickness of the field oxide film is from 0.3 μm to 2.0 μm.

* * * * *